(12) United States Patent
Na

(10) Patent No.: US 6,942,498 B2
(45) Date of Patent: Sep. 13, 2005

(54) PORTABLE ELECTRONIC APPARATUS HAVING EXTERNAL CONNECTOR FIXED AT INTERNAL CIRCUIT BOARD

(75) Inventor: Sang Ju Na, Suwon (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 10/351,447

(22) Filed: Jan. 27, 2003

(65) Prior Publication Data

US 2003/0139072 A1 Jul. 24, 2003

Related U.S. Application Data

(62) Division of application No. 09/854,697, filed on May 15, 2001, now Pat. No. 6,537,085.

(30) Foreign Application Priority Data

May 15, 2000 (KR) ........................................ 2000-25852

(51) Int. Cl.[7] .............................................. H01R 24/04
(52) U.S. Cl. ...................................... 439/76.1; 439/676
(58) Field of Search ................................ 439/76.1, 490, 439/569, 676

(56) References Cited

U.S. PATENT DOCUMENTS

| | | | |
|---|---|---|---|
| 4,379,606 A | 4/1983 | Clark et al. ............. | 339/17 CF |
| 4,626,633 A | 12/1986 | Ruehl et al. ................... | 379/27 |
| 4,850,902 A | * 7/1989 | Reed .......................... | 439/676 |
| 4,978,317 A | 12/1990 | Pocrass ...................... | 439/490 |
| 5,547,397 A | 8/1996 | Hirai .......................... | 439/607 |
| 5,613,873 A | 3/1997 | Bell, Jr. ....................... | 439/490 |
| 5,989,042 A | 11/1999 | Johnson et al. ............. | 439/131 |
| 6,004,144 A | 12/1999 | Yeh et al. ................... | 439/76.1 |
| 6,068,520 A | * 5/2000 | Winings et al. ............. | 439/676 |
| 6,174,194 B1 | * 1/2001 | Bleicher et al. ............. | 439/676 |
| 6,224,417 B1 | 5/2001 | Belopolsky et al. ......... | 439/490 |

OTHER PUBLICATIONS http://supportnet.merit.edu/m–intint/t–lantec/text/hard.html—SupportNET Online: Introduction to LAN hardware—Oct. 22, 2004—pp. 1, 13, 14.*

* cited by examiner

Primary Examiner—Renee Luebke
(74) Attorney, Agent, or Firm—Birch, Stewart, Kolasch & Birch, LLP

(57) ABSTRACT

A portable electronic apparatus includes: a box-type case having an opening at its rear face and upper face; a circuit board having a receiving portion and an engaging hole formed adjacent to the receiving portion, the circuit board being installed inside the case; a keyboard unit positioned at an upper surface of the case; and a connector having a front face with a plug inserting portion, a side face having a fixing piece and a lower face, wherein the lower face of the connector penetrates the receiving portion and is fixed at the circuit board, and the plug inserting portion of the connector faces the opening. Since the connector is positioned penetrating the receiving portion formed at the circuit board, the connector may be positioned at about the middle position of the connector, to make the whole product thin. In addition, in case where a flexible printed circuit is used to connect the connector and the circuit board, the plurality of terminals included in the connector can be connected simply with the circuit board and interference with other components can be minimized.

8 Claims, 6 Drawing Sheets

PORTABLE ELECTRONIC APPARATUS HAVING EXTERNAL CONNECTOR FIXED AT INTERNAL CIRCUIT BOARD

This application is a divisional of Application No. 09/854,697, filed on May 15, 2001 now U.S. Pat. No. 6,537,085, the entire contents of which are hereby incorporated by reference and for which priority is claimed under 35 U.S.C. §120; and this application claims priority of Application No. 2000-25852 filed in Korea on May 15, 2000 under 35 U.S.C. §119.

BACKGROUND OF THE INVENTION

1. Field of the Invention

The present invention relates to a portable electronic apparatus having an external connector fixed at an internal circuit board, and more particularly to an electronic apparatus having a connector suitable to an ultra-thin product for providing an electrical connection for data communication.

2. Description of the Background Art

Generally, electric apparatuses include a circuit board (PCB) in its main body to perform various functions and a connector fixed by soldering at the circuit board to connect a cable such as a LAN or a MODEM.

U.S. Pat. Nos. 4,978,317 and 5,613,873 disclose a technique related to such a connector, and FIG. 1 is a perspective view of a partial section of a connector presented in the U.S. Pat. No. 4,978,317.

With reference to FIG. 1, a connector 1 includes a housing 3 in a rectangular shape contouring the outer case and a plug inserting portion 5 to which a plug (not shown) of a cable is inserted for a connection.

A plurality of conductors 7 are formed at a portion at an inner side of the plug inserting portion 5 for electrical connection with the plug. The connectors 7 penetrate the housing 3 from one inner side of the plug inserting portion 5, so that connection leads 7a are protrusively formed at one face (upper side in FIG. 1).

The connection leads 7a protrusively formed at one face of the housing 3 are inserted into holes formed at the circuit board (PCB) to be protruded to the other side of the circuit board. The protruded connection leads 7a and a circuit pattern formed on the circuit board (PCB) are soldered to connect the circuit board (PCB) and the connector 1.

The connector 1 further includes an LED 9 for displaying a transmission state of a signal transmitted according to a connection between the connector 1 and the plug. The LED 9 is installed exposed in parallel at one side, that is, at the side where the plug inserting portion 5 is formed. The terminals 9a of the LED 9 are protrusively formed at the same face where the conductors 7 are protruded, so as to be inserted into the holes of the circuit board (PCB) and fixedly connected by soldering, like the connection leads 7a.

However, the conventional connector constructed as described has the following problems.

Because it is used to connect the circuit board and an external product, the connector maintains an interface as the terminals protruded at one face of the housing are directly soldered or mounted on an upper surface of the circuit board.

In addition, an installation space is required according to the height of various components attached on the under surface of the circuit board, and further, a space is also required to prevent an electric short between elements.

As a first example, the conventional connector is not readily adaptable to an ultra-thin product such as a super-thin lap-top computer which is restricted in its height.

Secondly, since the exposing hole is formed only at one side of the main body to expose the plug inserting portion of the connector outwardly, it is difficult to reduce the entire thickness of the main body.

Thirdly, as the connector is fixed at the circuit board (PCB) by the connection leads 7a and 9a, the fixed state of the connector is not reliable, so that when the connection operation of the plug is repeatedly performed, the soldering between connection leads and the circuit pattern of the circuit board (POB) is damaged, thereby causing an opening phenomenon. In the case of a few number of the connection leads, the housing is enlarged to obtain a contact area with respect to the circuit board, which, however, results in the enlargement of the connector contrary to the goal of obtaining a compact size product.

Fourthly, the connecting wires are used to connect the connection leads and the circuit board. In such a case, the connection leads can be processed by clamping, but the connection leads of the two LEDs should be directly soldered with the wire. In addition, in a specific case wherein more than two wires must be simultaneously clamped or soldered with one connection lead, many defects result. Defective wire is not reused, thereby causing an increase in unit costs.

Fifthly, in case of using the dip-soldering type connector, an interface cable to be connected to a LAN card (3 Combo, Intel Combo, X-Combo) and a connector are additionally required, causing an increase in the number of components.

The above references are incorporated by reference herein where appropriate for appropriate teachings of additional or alternative details, features and/or technical background.

SUMMARY OF THE INVENTION

Therefore, an object of the present invention is to provide a portable electronic apparatus having a connector fixing structure for an ultra-thin product.

Another object of the present invention is to provide a connector allowing a small space for connection with a circuit board and having less interference with other components.

To achieve at least the above objects in whole or in part, there is provided a portable electronic apparatus, including a box-type case having an opening at its rear face and upper face; a circuit board having a receiving portion and an engaging hole formed adjacent to the receiving portion, the circuit board being installed inside the case; a keyboard unit positioned at an upper surface of the case; and a connector having a front face with a plug inserting portion, a side face having a fixing piece and a lower face, wherein the lower face of the connector penetrates the receiving portion and is fixed at the circuit board, and the plug inserting portion of the connector faces the opening.

To achieve at least these advantages in whole or in part, there is further provided a portable electronic apparatus including a box-type lower case having a rear face with a first opening, the box-type lower case being combined with an upper case; a box-type upper case having a rear face with a third opening and an upper face; a circuit board having a receiving portion and engaging holes formed adjacent to the receiving portion, the circuit board being installed in the lower case; a keyboard unit positioned at an upper face of the upper case; a screen display unit rotatably supported by the upper case; and a connector having a front face with a plug inserting portion, a side face having a fixing piece and a lower face, wherein the bottom of the connector penetrates the receiving portion, to be fixed at the circuit board, and the plug inserting portion of the connector faces the first opening and the third opening.

To achieve at least these advantages in whole or in part, there is further provided a portable electronic apparatus including a box-type lower case having a rear face with first and second openings, the box-type lower case being combined with the upper case; a box-type upper case having rear face and upper face with third and fourth openings; a circuit board having a receiving portion and engaging holes formed adjacent to the receiving portion, the circuit board being installed in the lower case; a keyboard unit positioned at an upper face of the upper face; a screen display unit rotatably supported by the upper case; and a connector having a front face with first and second plug inserting portions, a side face having a fixing piece and a lower face, wherein the bottom of the connector penetrates the receiving portion, to be fixed at the circuit board, and the first plug inserting portion and the second plug inserting portion face the first openings.

To achieve at least these advantages in whole or in part, the connector of the present invention includes a housing having a plug inserting portion opened at a front face, a mounting groove formed from the front face to a rear face at an upper face, a cut-out portion connected to the mounting groove across the mounting groove at an upper portion of the rear end and a fixing piece integrally formed with the housing for engagement with the circuit board at the right and the left side of the housing; and a connector extendedly formed from the plug inserting portion to the cut-out portion, and electrically connected with a plug inserted into the plug inserting portion, one end thereof being protruded to the cut-out portion.

BRIEF DESCRIPTION OF THE DRAWINGS

The invention will be described in detail with reference to the following drawings in which like reference numerals refer to like elements wherein.

DETAILED DESCRIPTION OF THE PREFERRED EMBODIMENTS

A preferred embodiment of an installation structure for a connector of a portable electronic apparatus having an external connector fixed at an internal circuit board (PCB) and the connector will now be described with reference to the accompanying drawings.

FIGS. 2 through 9 show a portable electronic apparatus having an external connector fixed at an internal circuit board adapted to an ultra-thin type lap-top computer in accordance with a preferred embodiment of the present invention.

The construction of the portable electronic apparatus having an external connector fixed at an internal circuit board (PCB) will now be described.

Figure 1:
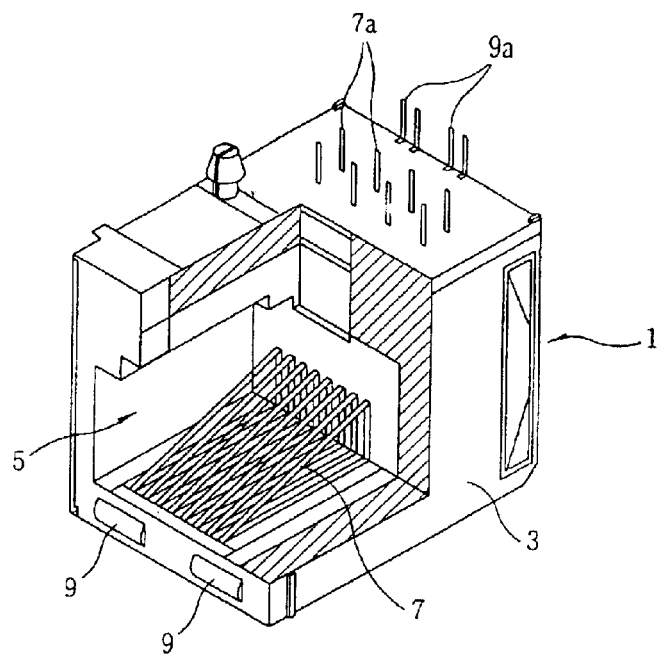
FIG. 1 is a partial perspective view showing the construction of a connector in accordance with a conventional art.
Figure 2:
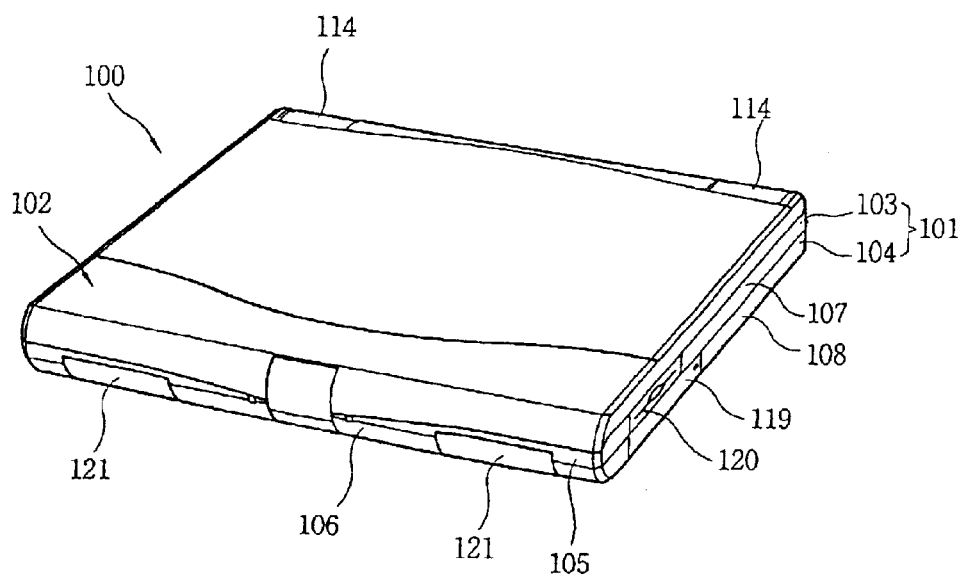
FIG. 2 is a perspective view showing an outer case of a ultra-thin type lap-top computer.
Figure 3:
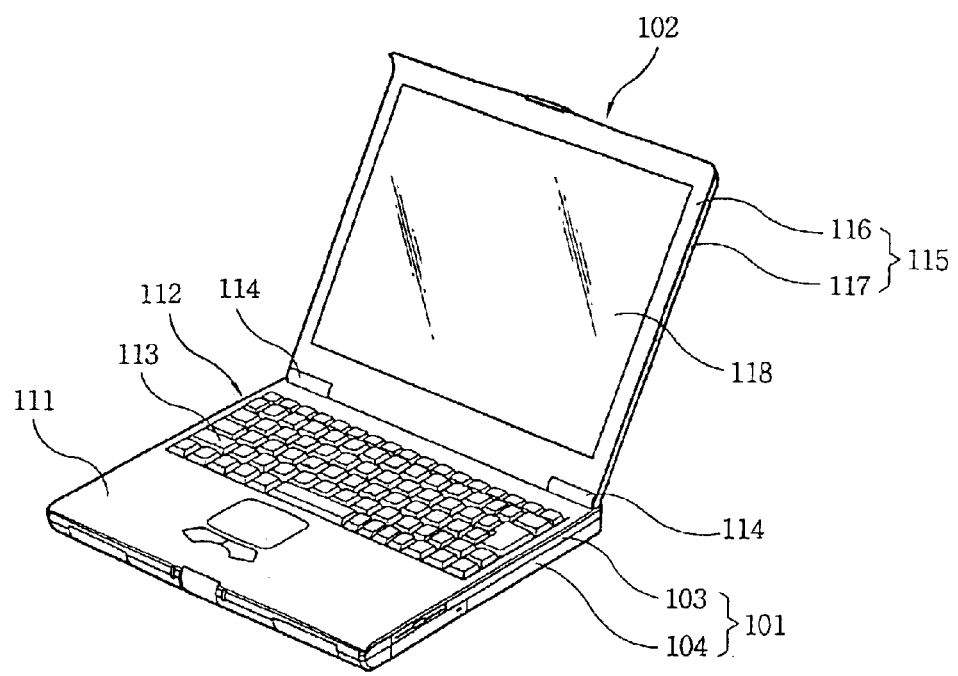
FIG. 3 is a perspective view showing a use state of the ultra-thin type lap-top computer.
Figure 4:
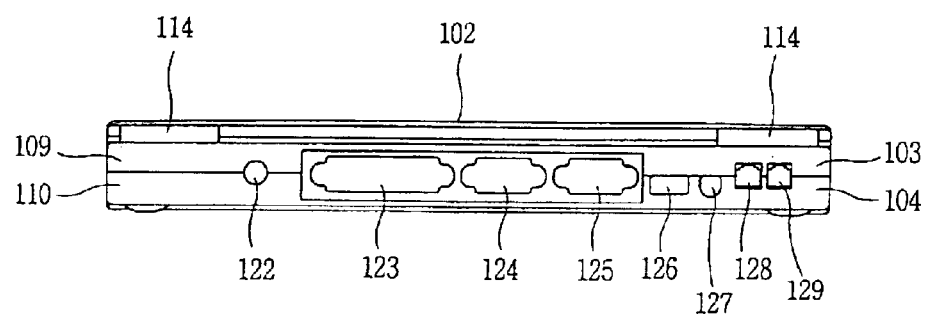
FIG. 4 is a plan view showing a rear side of the ultra-thin type lap-top computer.
Figure 5:
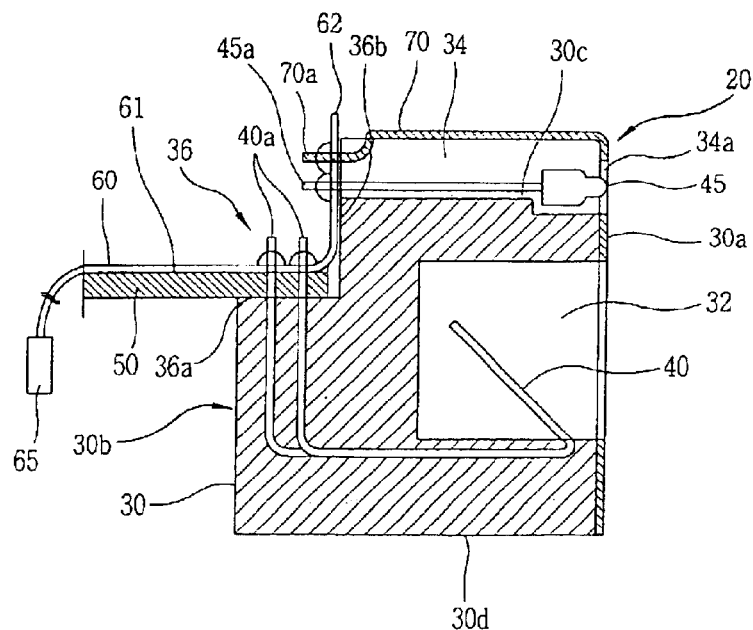
FIG. 5 is a sectional view showing the construction of a connector in accordance with a preferred embodiment of the present invention.

With reference to FIGS. 2 through 4, the ultra-thin type lap-top computer 100 has a box type body 101 and a flat screen display unit 102.

The body 101 includes a plastic upper case 103 and lower case 104.

The upper case 103 includes a first front face 105 and a first side face 107, and the lower case 104 includes a second front face 106 and a second side face 108.

As a data storage unit detachably combined with the body 101, an optical disk driver 119 is positioned at a side of the second side face 108 of the lower case 104. A floppy disk driver 120 is disposed at a portion of the upper case 103, at the uppermost position of the optical disk driver 119.

At the first front face 105 and the second front face 106 of the upper case 103 and the lower case 104 constructing the front face of the body 101, two speakers 121 are disposed over the upper case 103 and the lower case 104.

Referring to FIG. 4, the upper case 103 and the lower case 104 of the body 101 also includes a first rear face 109 and a second rear face 110 at the opposite side of the first front face 105 and the second front face 106.

The first rear face 109 and the second rear face 110 are formed by being successively extended from the first side face 107 and the second side face 108. As the first rear face 109 of the upper case 103 and the second rear face 110 of the lower case 104 are combined, the rear side is formed.

A plurality of connection ports are installed at the rear side so as to be connected with an external instrument.

The connectors include a power connection port 122, a parallel port 123, a serial port 124, a video port 125, a keyboard port 126 and a mouse port 127, a LAN connecting connector 128 and a modem port 129. These connectors are connected to the circuit board 90 installed inside the body 101.

Referring to FIG. 3, the screen display unit 102 is rotatably installed at a hinge unit 114 formed at both sides of the rear end of the body 101, forming a closed state as shown in FIG. 2 and an opened state as shown in FIG. 3.

The structure of the screen display unit 102 includes a very thin rectangular body 115 consisting of a rectangular case 117 metal plated for shielding at its inner surface and connected to the hinge unit 114, a liquid crystal display device 118 fixedly installed in the case 117 and a cover 116 combined with the case 117, covering the outer marginal portion of the display device 118 with its central portion exposed.

The display device 118 is connected to the circuit board 90 installed in the body 101 by a flexible printed circuit (FPC) (not shown).

The upper case 103 of the body 101 has an upper face 111 formed wherein it is bent successively at the end portion of the first side face 107 and the first front face 105 from the upper portion, and a keyboard unit 112 having a plurality of keys 113 are detachably installed at the upper face 111.

The construction of the connector which connects a LAN or a modem cable adapted to an ultra-thin lap-top computer 100, a portable electronic apparatus, having an external connection connector fixed at the internal PCB will now be described.

A housing constructing the connector 20 has a rectangular parallel-pipe shape. A plug inserting portion 32 is formed at the front wall 30a of the housing 30, into which a plug (not shown) of a LAN or a modem cable is inserted.

At the upper wall 30c of the housing 30, an LED receiving groove 34 is formed from the front wall 30a of the housing 30 to the rear wall 30b. An LED opening and supporting portion 31a is formed to be made small at a portion where it approaches the front face 30a of the receiving groove 34.

Two LED receiving grooves 34 are formed in parallel at the left side 30e and right side 30f. A cut-out portion 36 is connected to the LED receiving groove 34 from the left side wall 30e of the housing 30 to the right side wall 30f, that is, across the direction in which the LED receiving groove 34 is formed at a lower stage than the part of LED receiving groove 34 at the rear end of the housing 30.

A connection terminal 40 is installed for electrical connection with the plug (not shown) in the plug inserting portion 32 of the housing 30.

The connection terminal 40 penetrates the inner side of the lower wall 30d of the housing and bent by 90° toward the upper face 30c so that its one end portion (a connection lead) 40a is protrusively formed to an upper surface 36a of the cut-out portion 36.

The connection terminal 40 is slanted at a predetermined angle inwardly in the plug inserting portion 32, so that when the plug (not shown) is inserted, the connection terminal 40 is elastically deformed and tightly combined to the terminal of the plug.

The connection terminal 40 is formed by plural numbers such as 4, 6 and 8 depending on the type of connector, that is, type of communication module.

The connection terminal 40 is inserted to be integrally formed with the housing 30 when the housing 30 is molded in an insert-molding method.

The LEDs 45 are installed in the housing 30 to display the connection state and the operation state with respect to the plug (not shown). The front end of the LED 45 is positioned at the front end of the LED receiving groove 34, that is, at the LED opening and supporting portion 34a at the side of the front wall 30a, so that it can be viewed from the front face of the housing 30.

The LED opening and supporting portion 34a is formed slightly smaller than the front end of the LED 45 so that when the front end of the LED 45 is inserted into the LED opening and supporting portion 34a, the front end of the LED 45 is firmly fixed to the LED opening and supporting portion 34a.

The LED terminal 45a formed at the rear end of the LED 45 is extended to the rear wall 30b of the housing 30 within the LED receiving groove 34 and the end portion thereof is protruded to the front surface 36b of the cut-out portion 36.

In order to block an electronic wave from flowing to the lower wall 30d of the housing 30, a shielding plate 70 is mounted to integrally cover the front wall 30a and the upper wall 30c.

The shielding plate 70 contacts the lower case 104 in view of the improvement in EMI performance.

A shielding end portion 70a is protrusively formed to the front surface 36b of the cut-out portion 36 at the end of the shielding plate 70. The upper surface of the shielding plate 70 supports the LED 45 installed at the LED receiving groove 34 of the housing 30 upwardly to prevent the LED 45 from releasing.

Figure 6:
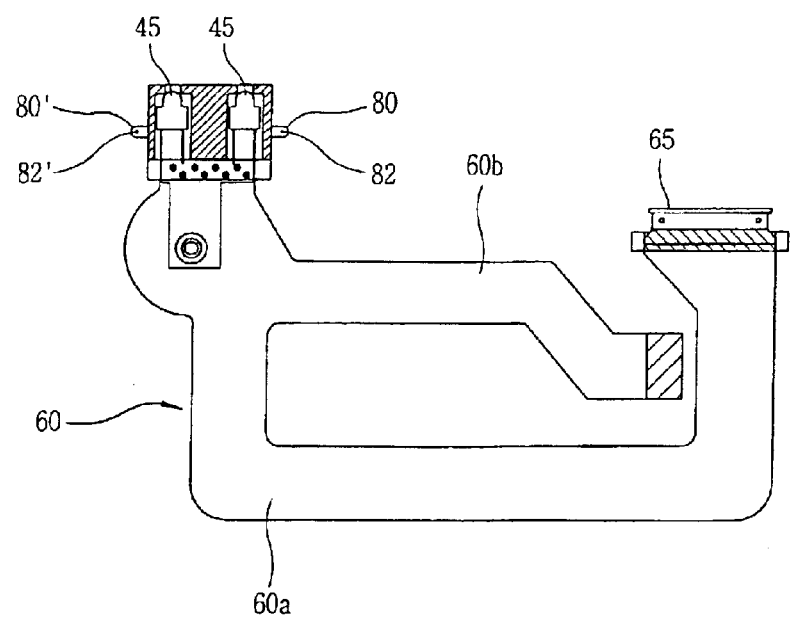
FIG. 6 is a plan view showing the construction of the connector in accordance with the preferred embodiment of the present invention.

With reference to FIG. 6, a flexible cable 60b is installed including a flexible cable 60a for a circuit board LAN cable and a flexible cable 60b for a docking LAN cable which are integrally formed.

The flexible cable 60a for a circuit board LAN cable serves to transmit a signal between the connector 20 and the circuit board 90, and the flexible cable 60b for a docking LAN cable serves to transmit a signal between the connector 20 and a docking system (not shown). One end portion 40a of the connection terminal 40, the LED terminal 45a of the LED 45, the shield terminal 70a of the shielding plate and a pad 61 of the flexible printed circuit 60 are connected by soldering to the flexible printed circuit 60, to transmit a signal.

With reference back to FIG. 5, a reinforcement film 50 is fixedly attached at the bottom surface of the pad 61 of the flexible printed circuit 60 at a distance from the tip 62 of the pad 61, and the tip 62 of the pad 61 is readily bent without the reinforcement film 50.

The pad 61 is tightly attached on the upper surface 36a of the cut-out portion 36, so that the end portion 40a of the connection terminal 40 exposed on the upper surface 36a penetrates the pad 61, so as to be exposed, and the connection end portion 40a and a circuit pattern of the flexible printed circuit 60 are connected by soldering.

Thereafter, the tip 62 of the pad 61 is bent to be tightly attached on the front surface 36b of the cut-out portion 36, so that the LED terminal 45a and the shield terminal 70a of the shielding plate penetrate the tip 62 of the pad 61 and is exposed. The exposed LED terminal 45a and the shield terminal 70a of the shielding plate are connected with the circuit pattern of the flexible printed board 60 by soldering.

Figure 7:
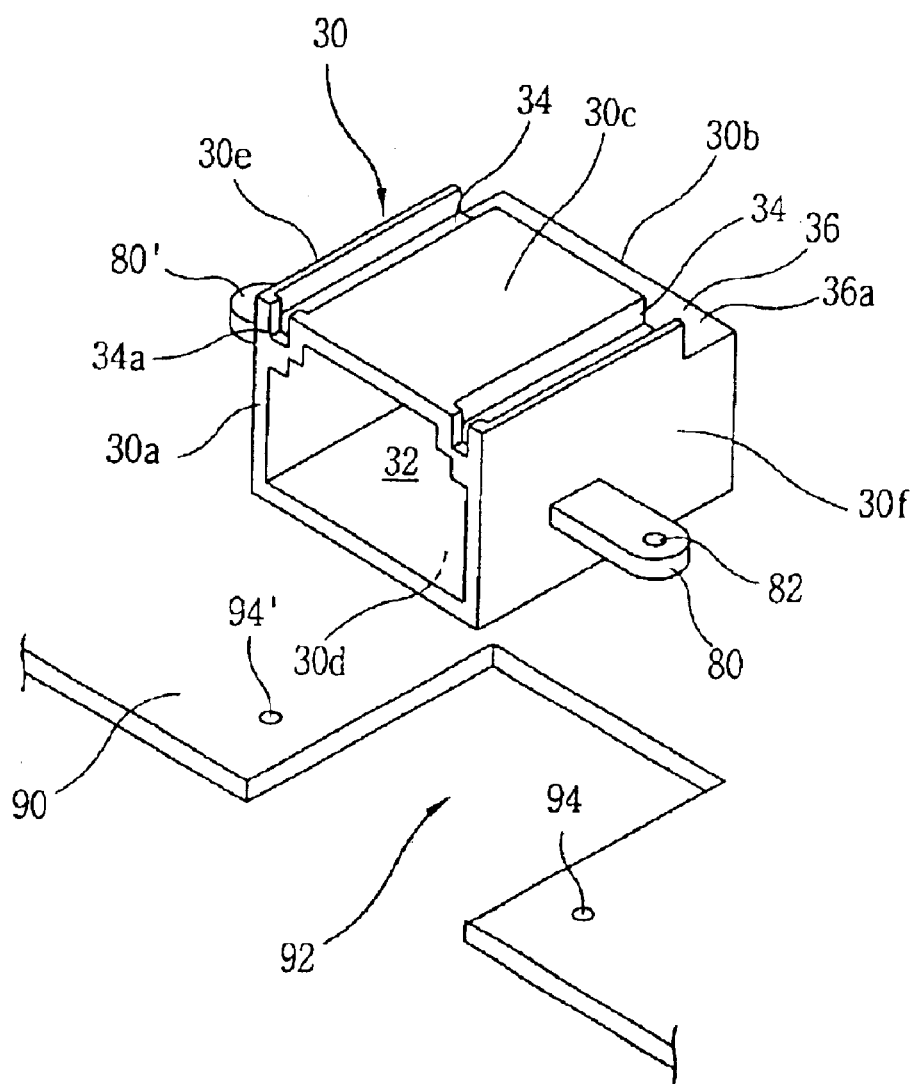
FIG. 7 is a schematic exploded perspective view showing that a housing of the connector and mounting of the housing at a circuit board in accordance with the preferred embodiment of the present invention.
Figure 9:
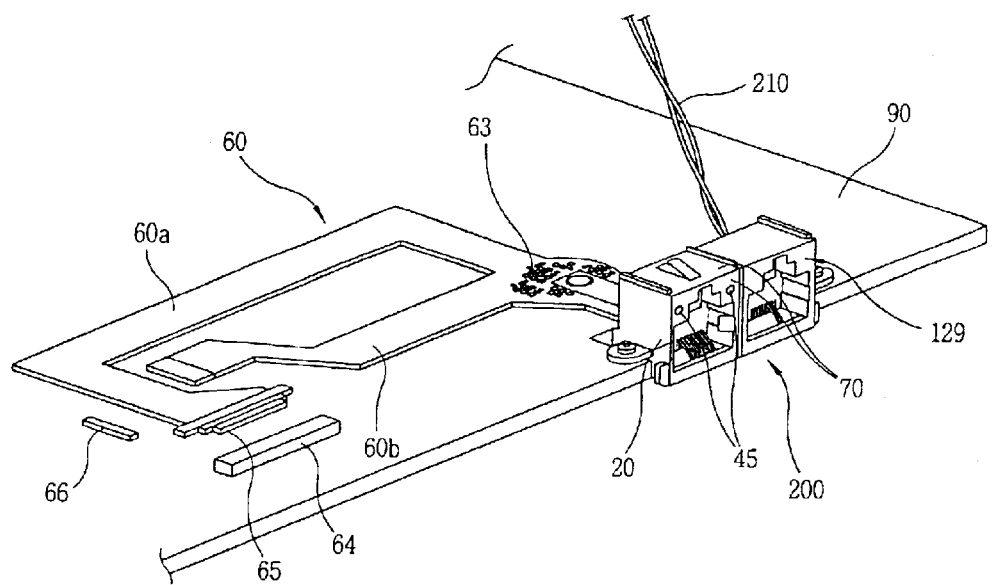
FIG. 9 is a perspective view showing a state that the connector is mounted at the circuit board in accordance with the preferred embodiment of the present invention.

With reference to FIGS. 7 and 9, a connector 65 and a connecting member for connection with the circuit board 90, is provided at the other end of the opposite side of the flexible cable 60a for a circuit board LAN cable connected with the housing 30. Various components 63 for the prevention of electromagnetic interference (EMI) such as an EMI filter conventionally installed on the circuit board 90 are installed on the flexible printed circuit 60.

Two fixing pieces 80 and 80' are protrusively formed at predetermined positions of both side walls 30e and 30f of the housing 30 to fix the connector 20 at the circuit board 90.

The fixing pieces 80 and 80' are formed at about the middle position of the side walls 30e and 30f, somewhat inclined to the front wall 30a.

Engaging holes 82 and 82' are formed at the center of the fixing pieces 80 and 80', and the position of the fixing pieces 80 and 80' may be suitably varied according to a designing condition.

As shown in FIG. 7, the connector 20 is mounted at the circuit board 90. Various components for functions, including components for connection with the connector 20, are mounted at the circuit board 90.

A receiving portion 92 is formed at one end portion of the circuit board 90 to receive the connector 20. The receiving portion 92 is formed by cutting out one rear end portion of the circuit board 90, in which the housing 30 of the connector 20 is mounted.

Engaging holes 94 and 94' are formed at positions at both end portions of the circuit board 90 corresponding to the engaging holes 82 and 82' of the fixing pieces 80 and 80' installed at both ends of the housing 30.

The mounting operation of the connector 20 having the construction as described above will now be explained.

The connector 20 forms a cut-out portion 36 at the upper portion of the rear end of the housing 30, so that connection ends 40a, 45a and 70a (to be connected from the connector 20 to the circuit board 90) are protrusively formed at the cut-out portion 36. Thus, each terminal is positioned in the cut-out portion 36 without being protruded to the surface of the upper wall 30c and the rear wall 30b of the housing 30.

The connector 20 is mounted at the circuit board 90. As shown in FIG. 7, the housing 30 is mounted at the receiving portion 92 formed at the circuit board 90. At this time, the engaging holes 82 and 82' of the fixing pieces 80 and 80' formed at the left and right outer faces of the housing 30 comes in contact with the corresponding engaging holes 94 and 94' formed at the circuit board 90, and a screw 95 is suitably inserted between the engaging holes 82, 82', 94 and 94'.

Accordingly, the rear wall 30b of the housing 30 penetrates the receiving portion 92 and is positioned below the circuit board 90, and the circuit board 90 is positioned at about the middle portion of the housing 30, which may be different according to the height of the fixing pieces 80 and 80' formed at the housing.

Next, the connector 65 of the flexible cable 60a for a circuit board LAN cable is connected to a connecting unit 64 of the circuit board 90, and then, one end of the flexible cable 60b for a decking LAN cable is connected with the connector 66 for a docking system, thereby completing mounting of the connector 20.

Figure 8:
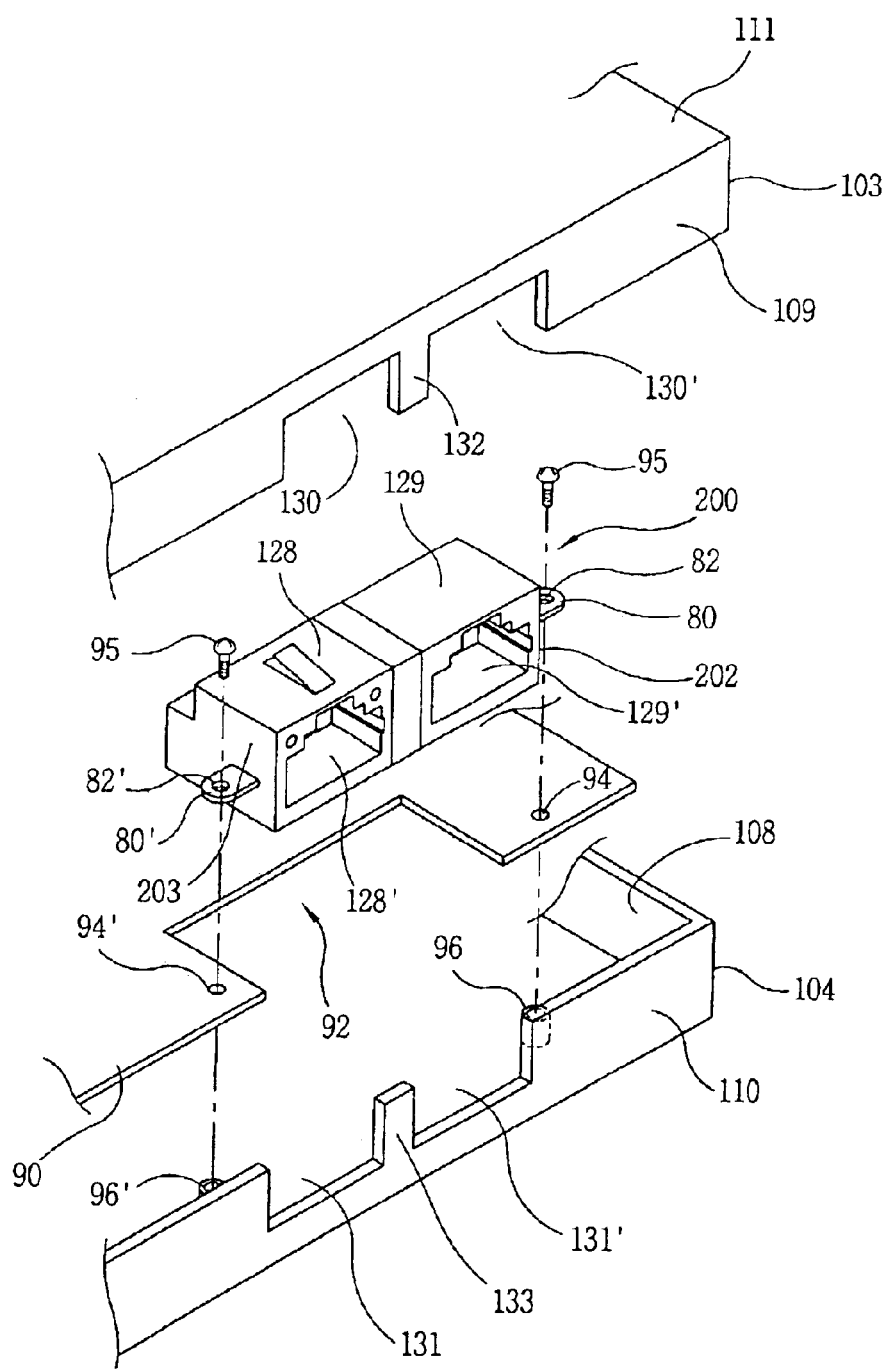
FIG. 8 is a perspective view showing a coupling state of the connector, the circuit board and a case in accordance with the preferred embodiment of the present invention.

FIGS. 8 and 9 are drawings illustrating a dual-type connector 200 in which a modem connector 129 is integrally formed with the connector 20 in accordance with another embodiment of the present invention.

The dual-type connector 200 is so constructed that a modem connector 129 is integrally formed at the right side wall 30f of the LAN connecting connector and fixing pieces 82 and 82' are formed at the left side wall 30e of the LAN connecting connector 128 and at the right side face 202 of the modem connector 129.

A first opening 131 and a second opening 131' are formed at the second rear face 110 of the lower case 104 of the body 101 exposing the plug inserting portion 32 of the dual-type connector 200. A protrusion 133 is formed between the two openings 131 and 131'. Supporting bosses 96 and 96' are protruded upwardly at the position corresponding to the engaging holes 94 and 94' of the circuit board 90.

A third opening 130, a fourth opening 130' and a protrusion 132 are formed at the first rear face 109 of the upper case 103 corresponding to the openings 131 and 131' and the protrusion 133. A connecting modem cable 210 is engaged at the rear end of the modem connector 129.

After the circuit board 90 is positioned inside the lower case 104, when the lower wall of the dual type connector 200 is inserted in the receiving portion 92, the fixing pieces 80 and 80' formed at both side walls of the dual-type connector 200 contact with the upper face of the circuit board 90, supporting the installation of the connector.

Thereafter, the screw 95, an engaging member, penetrates the engaging holes 82 and 82' of the fixing pieces 80 and 80' and the engaging holes 94 and 94', to be fixed at the supporting bosses 96 and 96' of the lower case 104. Accordingly, the circuit board 90 and the connector 200 are simultaneously fixed.

Besides the dual type connector 200, such a fixing structure is adapted in the same manner even in case where the LAN connecting connector 20 is solely used.

The operational effects of the connector of the present invention are as follows.

As so far described, since the connector is positioned penetrating the receiving portion formed at the circuit board, the connector may be positioned at about the middle position of the connector, to make the whole product thin.

In addition, as stated above, in a case where a flexible printed circuit is used to connect the connector and the circuit board, the plurality of terminals included in the connector can be connected simply with the circuit board and interference with other components can be minimized. Since the cut-out portion is formed at the housing so that various terminals are not protruded outwardly of the housing, the height of the connector is reduced to be thin, and thus, it can be adapted to an ultra-thin product.

In addition, since the connector is engaged at the circuit board by using an additional engaging member, the connector is firmly supported. Thus, in spite of frequent occurrences of connecting and disconnecting, it can be stably connected with the circuit board. Moreover, since the connector and the circuit board are fixed at the lower case by a one-time engaging operation, productivity can be increased.

Furthermore, since the flexible printed circuit (FPC) is used, a bead or a capacitor (component for preventing the electromagnetic interference (EMI) such as the EMI filter) which has been installed for use on the circuit board, can be mounted on the flexible printed circuit, and spatial utilization on the circuit board is increased and the performance of the EMI is remarkably improved.

Also, since the shielding plate integrally formed at the upper face and the front face of the connector comes in contact with the bottom case of a main body of a computer, the performance of the EMI is more enhanced.

In addition, for a connection, the flexible printed circuit is used, rather than the clamping as in the conventional art, so that the connection is simplified, resulting in an effect that defects are considerably reduced.

Moreover, since each terminal is directly soldered to the flexible printed board, even a combo card is connected by cable, the production process is reduced and productivity is much enhanced.

Furthermore, since the upper end portion of the connector is opened, the LED can be easily inserted. Also, when the LED and the connection terminal of the LED are defective, they can be easily replaced. Thus, compared to the in-mold type connector, the unit cost can be reduced.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modification, and variations will be apparent to those skilled in the art. In the claims means-plus-function clauses are intended to cover the structure described herein as performing the recited function and not only structural equivalents but also equivalent structures.

What is claimed is:

1. A box-shaped connector assembly for an electronic apparatus, comprising:

a housing having a rear wall, an upper wall, a lower wall, a middle wall extending between the upper wall and the lower wall, a left side wall, a front face opposite the rear wall, and a right side wall, wherein said walls define two plug inserting portions opened at the front face, wherein the walls are made of an electrically insulative material, and a portion of the upper wall forms a cut-out portion at an outer surface of the housing, said cut-out portion having a width substantially equal to the width of said housing;

a plurality of conductors formed at an inner side of each plug inserting portion, wherein the conductors penetrate the housing so that terminals of the conductors protrude in the cut-out portion; and wherein a receiving groove is formed from the front face to a rear face at an upper face of the upper wall.

2. The box-shaped connector assembly of claim 1, further comprising at least one emitting member mounted in the receiving groove.

3. The box-shaped connector assembly of claim 2, wherein said emitting member includes an LED.

4. A box-shaped connector assembly for an electronic apparatus, comprising:

a housing having a rear wall, an upper wall, a lower wall, a middle wall extending between the upper wall and the lower wall, a left side wall, a front face opposite the rear wall, and a right side wall, wherein said walls define two plug inserting portions opened at the front face, wherein the walls are made of an electrically insulative material, and a portion of the upper wall forms a cut-out portion at an outer surface of the housing, said cut-out portion having a width substantially equal to the width of said housing;

a plurality of conductors formed at an inner side of each plug inserting portion, wherein the conductors penetrate the housing so that terminals of the conductors protrude in the cut-out portion;

wherein the cut-out portion is formed at an upper portion of the rear wall, and the height of the terminals of the conductors is lower than a height of the housing; and wherein a receiving groove is formed from the front face to a rear face at an upper face of the upper wall and the cut-out portion is connected to the receiving groove cross-wise to the receiving groove at an upper portion of the rear wall.

5. A box-shaped connector assembly for an electronic apparatus, comprising:

a housing having a rear wall, an upper wall, a lower wall, a middle wall, a left side wall, a front face opposite the rear wall, and a right side wall wherein said walls define two plug inserting portions opened at the front face, wherein the walls are made of an electrically insulative material, and a portion of the upper wall forms a cut-out portion at an outer surface of the housing, said cut-out portion having a width substantially equal to a width of the upper wall, a receiving groove that extends from the front face to a rear face at an upper face of the upper wall; and a plurality of conductors formed at an inner side of each plug inserting portion, wherein the conductors penetrate the housing so that terminals of the conductors protrude in the cut-out portion.

6. The box-shaped connector assembly of claim 5, further comprising a plurality of receiving grooves.

7. The box-shaped connector assembly of claim 5, further comprising a light emitting member located in the receiving groove.

8. The box-shaped connector assembly of claim 7, wherein said light emitting member comprises an LED.

* * * * *